US007224582B1

United States Patent
Saturley et al.

(10) Patent No.: US 7,224,582 B1
(45) Date of Patent: May 29, 2007

(54) FLOATING HEATSINK FOR REMOVABLE COMPONENTS

(75) Inventors: Peter Saturley, Ottawa (CA); John Clayton Atkinson, Ottawa (CA)

(73) Assignee: Nortel Networks Limited, St. Laurent, Quebec (CA)

( * ) Notice: Subject to any disclaimer, the term of this patent is extended or adjusted under 35 U.S.C. 154(b) by 25 days.

(21) Appl. No.: 10/945,075

(22) Filed: Sep. 20, 2004

(51) Int. Cl.
*H05K 7/20* (2006.01)
*H05K 5/00* (2006.01)

(52) U.S. Cl. .................. 361/687; 439/374; 385/92
(58) Field of Classification Search ........... 361/687; 385/92
See application file for complete search history.

(56) References Cited

U.S. PATENT DOCUMENTS

| 5,161,087 | A | | 11/1992 | Frankeny et al. | |
|---|---|---|---|---|---|
| 5,426,437 | A | * | 6/1995 | Cross et al. | 342/372 |
| 6,508,595 | B1 | * | 1/2003 | Chan et al. | 385/92 |
| 6,625,025 | B1 | * | 9/2003 | Duxbury et al. | 361/704 |
| 6,714,414 | B1 | | 3/2004 | Dubovsky et al. | |
| 6,811,326 | B2 | * | 11/2004 | Keeble et al. | 385/92 |
| 6,916,122 | B2 | * | 7/2005 | Branch et al. | 385/92 |
| 6,986,679 | B1 | * | 1/2006 | Aronson et al. | 439/374 |
| 6,992,895 | B2 | * | 1/2006 | Lindberg | 361/719 |
| 2003/0161108 | A1 | * | 8/2003 | Bright et al. | 361/707 |

* cited by examiner

*Primary Examiner*—Lisa Lea-Edmonds
*Assistant Examiner*—Ingrid Wright
(74) *Attorney, Agent, or Firm*—Ridout & Maybee LLP

(57) ABSTRACT

A floating heatsink is disclosed for components mounted within an electromagnetic enclosure. The floating heatsink includes an aperture within the enclosure wall against which a floating heatsink is disposed on the interior of the enclosure. The floating heatsink is dimensioned to overlap the enclosure around the aperture. A resilient bias member is disposed along the overlap between the floating heatsink and the enclosure. The resilient bias member acts as an electromagnetic gasket while urging the floating heatsink against the component. In certain embodiments the component is replaceable via a second aperture in the enclosure. The floating heatsink is particularly useful for overcoming the need for thermal compounds of heatsinks using the enclosure known in the art.

17 Claims, 6 Drawing Sheets

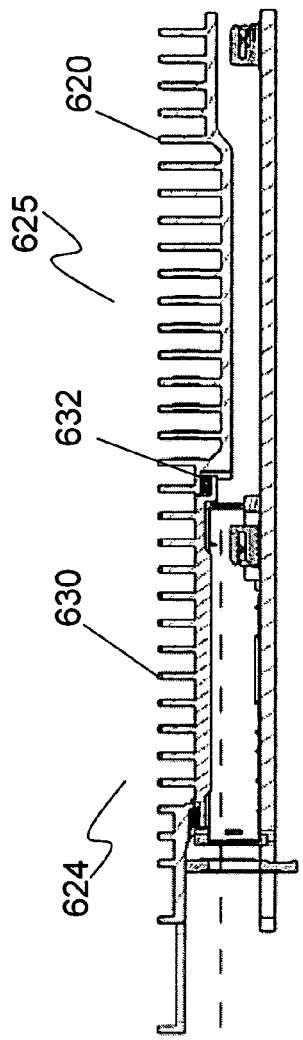
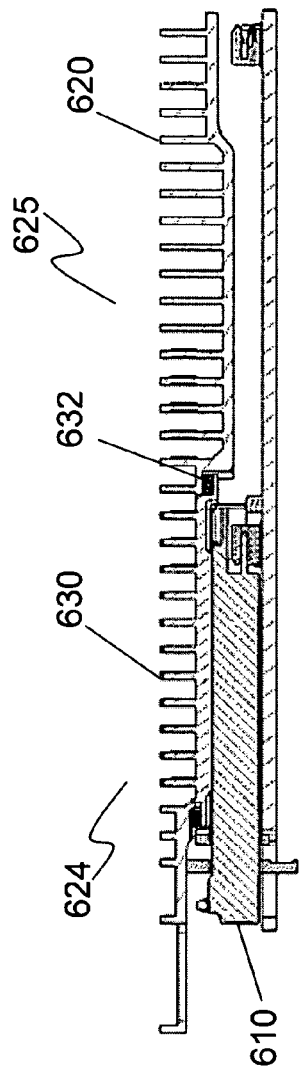
Figure 6A
Figure 6B

FLOATING HEATSINK FOR REMOVABLE COMPONENTS

FIELD OF THE INVENTION

The present invention relates to a floating heatsink for removable components and is particularly concerned with heatsinks for components requiring removal for servicing or replacement.

BACKGROUND OF THE INVENTION

Heat dissipation is a by-product of most modern electronic equipment, and when heat dissipation from a component or assembly is sufficiently large, then heatsinks are used to keep the component or assembly at a sufficiently low temperature.

An additional requirement of high-speed electronics is the containment and/or shielding of electromagnetic radiation developed by the circuitry during operation. Such electromagnetic radiation can disturb the functioning of other nearby electronic equipment, and vice versa. In order to contain electromagnetic radiation, it is known in the art to provide enclosures which either block or greatly attenuate emissions from a circuit in operation.

Under some circumstances, the electromagnetic containment enclosure can serve as a heatsink for components mounted within the enclosure. Typically, components are mounted within a circuit board within the enclosure, and means, such as a compliant thermal compound, are used to bridge gaps between a component and the enclosure wall that is to be used as a heatsink.

This approach does not provide for ready heatsinking of removable components, as there is no simple method for ensuring adequate emplacement of the thermal compound when a component is replaced.

In view of the foregoing, it would be desirable to provide a technique for allowing removal of components from an electromagnetic enclosure which overcomes the above-described inadequacies and shortcomings, by providing a mechanism which does not require a compliant thermal compound replacement but does provide heatsinking of the removable component and integrity of the electromagnetic enclosure.

SUMMARY OF THE INVENTION

An object of the present invention is to provide an improved floating heatsink for removable components.

According to an aspect of the present invention there is provided an apparatus for removing heat from a component to be mounted within an enclosure, where the enclosure has a first aperture adjacent to the component when the component is in an operating position. The apparatus has a floating heatsink disposed interior to the enclosure adjacent to the first aperture, and the floating heatsink is dimensioned to overlap the enclosure around the periphery of the first aperture. There is also a resilient bias member disposed between at least a portion of an overlap between the floating heatsink and the enclosure, wherein the resilient bias member acts as an electromagnetic gasket between the floating heatsink and the enclosure and whereby the resilient bias member urges the floating heatsink against the component in the operating position.

Advantages of the present invention include providing controllable thermal contact to a removable component while maintaining electromagnetic shielding integrity of the enclosure.

Conveniently the floating heatsink may have a channel thereinscribed on the surface adjacent to the enclosure, and the resilient bias member is disposed in the channel. Alternatively, the surface of the enclosure adjacent to the floating heatsink may have a channel thereinscribed, and the resilient bias member is disposed within this channel. The resilient bias member may be a formed metallic strip. The formed metallic strip may have a plurality of fingers, and the formed metallic strip may have a plurality of formed ridges. As well, the resilient bias member may be formed from an elastomeric compound having electrically conductive media dispersed therethrough.

Further, there may be provided a second resilient bias element to augment the bias provided by the resilient bias member. The use of a second resilient bias element provides an additional degree of control of the urging of the floating heatsink against the component.

Also conveniently, the enclosure may have a second aperture, and the component may be removed from the enclosure via the second aperture. A replacement component for a removed component may be installed via the second aperture.

In accordance with another aspect of the present invention there is provided a method for removing heat from a component to be mounted within an enclosure. The enclosure has a first aperture adjacent to the component when the component is in an operating position and the method comprising the steps of disposing interior to the enclosure a floating heatsink adjacent to the first aperture. The floating heatsink is dimensioned to overlap the enclosure around the periphery of the first aperture. As well, disposing a resilient bias member between an overlap between the floating heatsink and the enclosure, wherein the resilient bias member acts as an electromagnetic gasket between the floating heatsink and the enclosure. Further, by the action of the resilient biasing member, the floating heatsink is urged against the component, when the component is in the operating position.

The present invention will now be described in more detail with reference to exemplary embodiments thereof as shown in the appended drawings. It should be recognized that the diagrams are not intended to convey any indication of scale. While the present invention is described below including preferred embodiments, it should be understood that the present invention is not limited thereto. Those of ordinary skill in the art having access to the teachings herein will recognize additional implementations, modifications, and embodiments which are within the scope of the present invention as disclosed and claimed herein.

BRIEF DESCRIPTION OF THE DRAWINGS

The invention will be further understood from the following detailed description of embodiments of the invention and accompanying drawings in which:

FIG. 6 is a cross-sectional view of the heatsink assembly of FIG. 5 taken along section line 2 of FIG. 5.

DETAILED DESCRIPTION

Figure 1:
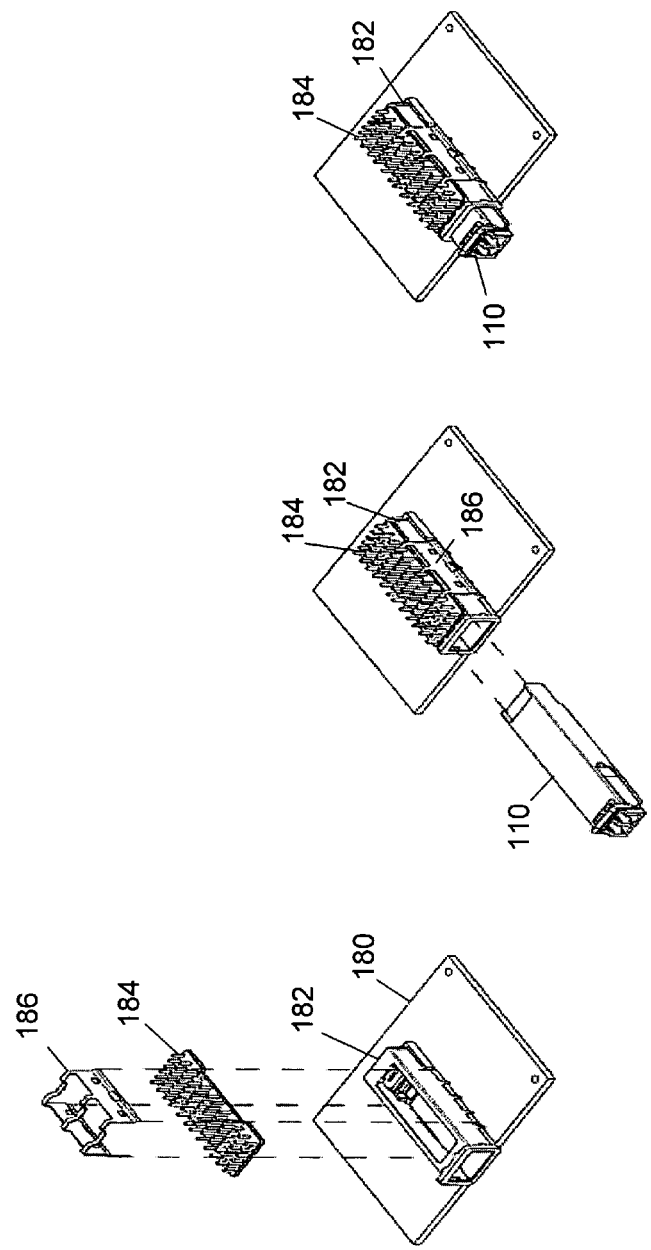
FIG. 1 is a perspective view of a component and heatsink assembly according to the prior art.

Certain terminology may be employed in the description to follow for convenience rather than for any limiting purpose. For example, the terms "top", "bottom", "forward", "rearward", "right", "left", "rightmost", "leftmost", "upper", and "lower" designate directions in the drawings to which reference is made. Terminology of similar import other than the words specifically mentioned above likewise is to be considered as being used for purposes of convenience rather than in any limiting sense. In the description and figures to follow, corresponding characters are used to designate corresponding elements throughout the several views, with equivalent elements being referenced with prime or sequential alphanumeric designations where appropriate to assist understanding.

Modern electronic circuit assemblies are progressively moving towards denser and denser concentrations of heat generating components within given package sizes. Increased density brings a need for enhanced means to remove heat, and as well, means to contain electromagnetic radiation generated by the circuitry during its operation. One approach known in the art is to completely enclose the electronic circuit board and attendant circuitry with a thermally conductive and electromagnetic radiation containing enclosure. A common term for such an enclosure which conforms relatively closely to the dimensions of a circuit card is that of a "clamshell". The clamshell enclosure has additional advantages in assisting in preventing exterior interfering radiation, such as that from adjacent circuit assemblies, from interfering with circuitry within the enclosure.

A relative disadvantage of a clamshell enclosure is the difficulty in replacing components. Within telecommunications systems, there are electronic assemblies with subassemblies which may have an operational life significantly less than the life of the remainder of the assembly. One example is the laser transceivers used in modern optical networking equipment. With a clamshell enclosure which contains multiple such laser transceiver assemblies, the failure of one assembly would require the removal of the entire clamshell if the failed assembly were to be replaced. Clearly, it would be desirable to have a clamshell enclosure which would admit removable subassemblies. However, in the case of laser transceiver assemblies, for example, there is a strong need for effective heatsinking of the transceiver assembly. In an assembly with permanently mounted transceivers, it is common in the art to use the wall of the clamshell enclosure as a heatsink, and appropriate means for securing the transceiver in good thermal contact with the wall are used.

In the case of removable assemblies, it is necessary to be able to remove the subassembly, yet when the subassembly is mounted in operational position, to also ensure adequate thermal contact.

Referring to FIG. 1A there may be seen an exploded view of a circuit board 180 having mounted thereon a frame 182, a heatsink 184, and a clip assembly 186. The frame 182 serves as a mounting enclosure for a removable component or assembly, while heatsink 184 is mechanically attached to frame 182 via clip assembly 186. Not shown is a connector mounted on circuit board 180, to which the removable component connects upon insertion into frame 182. Referring to FIG. 1B, there may seen a perspective view of the heatsink 184, secured to frame 182 with clip 186, while removable component 110 is shown prior to mounting within frame 182. In FIG. 1C, removable component 110 is shown mounted within frame 182. In the mounted position, heatsink 184, in mechanical contact with removable component 110, acts to reduce thermal resistance from removable component 110 to the ambient environment, thereby dissipating heat generated within removable component 110. The resulting reduction in temperature rises within removable component 110 act to keep temperatures within operational limits and enhance long term reliability of removable component 110, as is well known in the art.

One possible problem with the approach diagrammed in FIG. 1 is the sliding friction occurring between heatsink 184 and the removable component 110. Close mechanical contact between removable component 110 and heatsink 184 is necessary for good thermal flow, however manufacturing tolerances work against achieving the necessary fit. Intermediate resilient thermally conductive materials may be used to mediate the gap resulting from manufacturing tolerances, however, the high coefficient of friction that results from use of such materials results in unacceptably high forces being generated upon insertion and removal of removable component 110.

Figure 2:
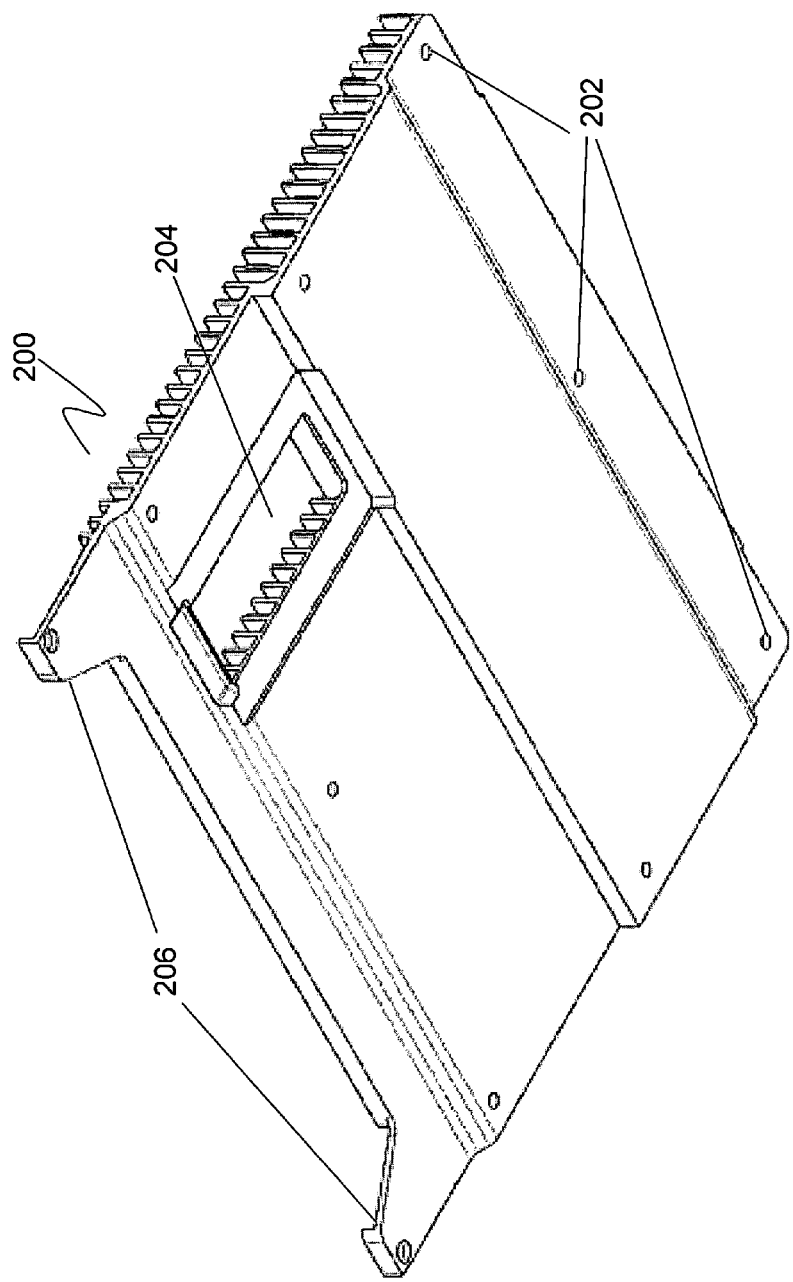
FIG. 2 is a perspective view from the bottom of a fixed portion of a heatsink assembly according to an embodiment of the invention.

Referring to FIG. 2, there may be seen a perspective view from the bottom, of one side 200 of a clamshell enclosure. On the enclosure side 200 may be seen mounting holes 202, for securing the enclosure side 200 to the circuit board and opposite side of the enclosure. Also visible is aperture 204, an opening in enclosure side 200, for the receiving of a floating heatsink which will be described below. Mounting tabs 206, at the front of enclosure side 200, are for the installation of card ejectors (not shown), mechanical latches which assist in insertion and removal of the clamshell assembly upon installation. The clamshell enclosure is conveniently made from a castable, extruded or machined aluminum alloy, providing both thermal conductivity and electromagnetic interference shielding.

Figure 3:
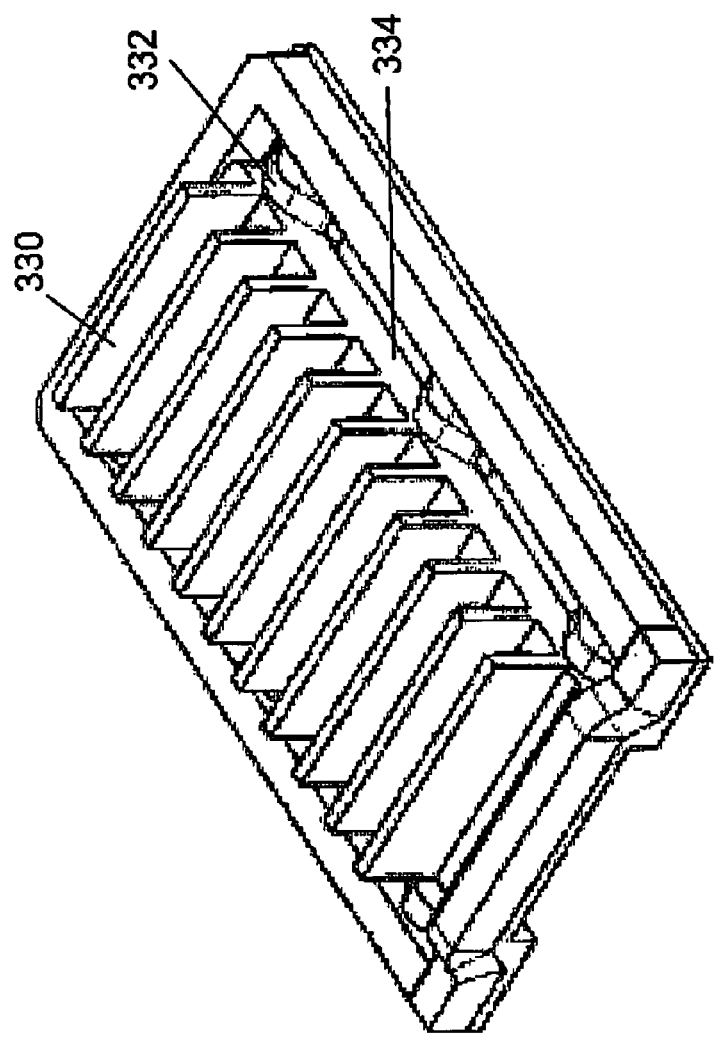
FIG. 3 is a perspective view from the top of a movable portion of a heatsink assembly according to an embodiment of the invention.

Referring to FIG. 3, there may be seen floating heatsink 330 with resilient bias member 332. Resilient bias member 332 operates to urge floating heatsink 330 against a removable component as will be illustrated in a following figure. Resilient bias member 332 also acts as an electromagnetic interference gasket around the periphery of floating heatsink 330, so as to contain electromagnetic energy within the clamshell enclosure. Resilient bias member 332 could be a multi-fingered metallic gasketing strip mounted in a channel 334 surrounding the periphery of floating heatsink 330. Alternatively, resilient bias member 332 could be a ridged metallic gasketing strip, having a succession of ridges formed in the strip to provide resilience. As a further alternative, resilient bias member 332 could be formed from an elastomeric compound having an electrically conductive media dispersed therein sufficient to attenuate electromagnetic radiation to the desired degree. In general, any resilient gasketing material known to those skilled in the art having a compression-set over its operating life sufficient to provide an appropriate biasing force to provide good thermal contact against a removable component while providing adequate electromagnetic interference gasketing could be employed.

Under certain applications, the amount of bias provided by the resilient gasketing material may be insufficient to provide the amount of bias desired. In these circumstances an additional bias element, for example a separate spring element, may be used to augment the bias provided by the resilient gasketing material. Such an additional bias element may consist of a spring element running parallel to the resilient gasketing material, or a plurality of spaced smaller springs, for example.

It is also clear that certain applications, for example circuitry having low frequency signals, may not require a continuous gasket around the periphery of the overlap. In this case, the resilient gasketing material may be disposed only over a portion of the overlap, or at a plurality of discontinuous portions, insofar as the emissions or susceptibility requirements regarding electromagnetic leakage through any gaps meet the requirements of the particular apparatus.

Figure 4:
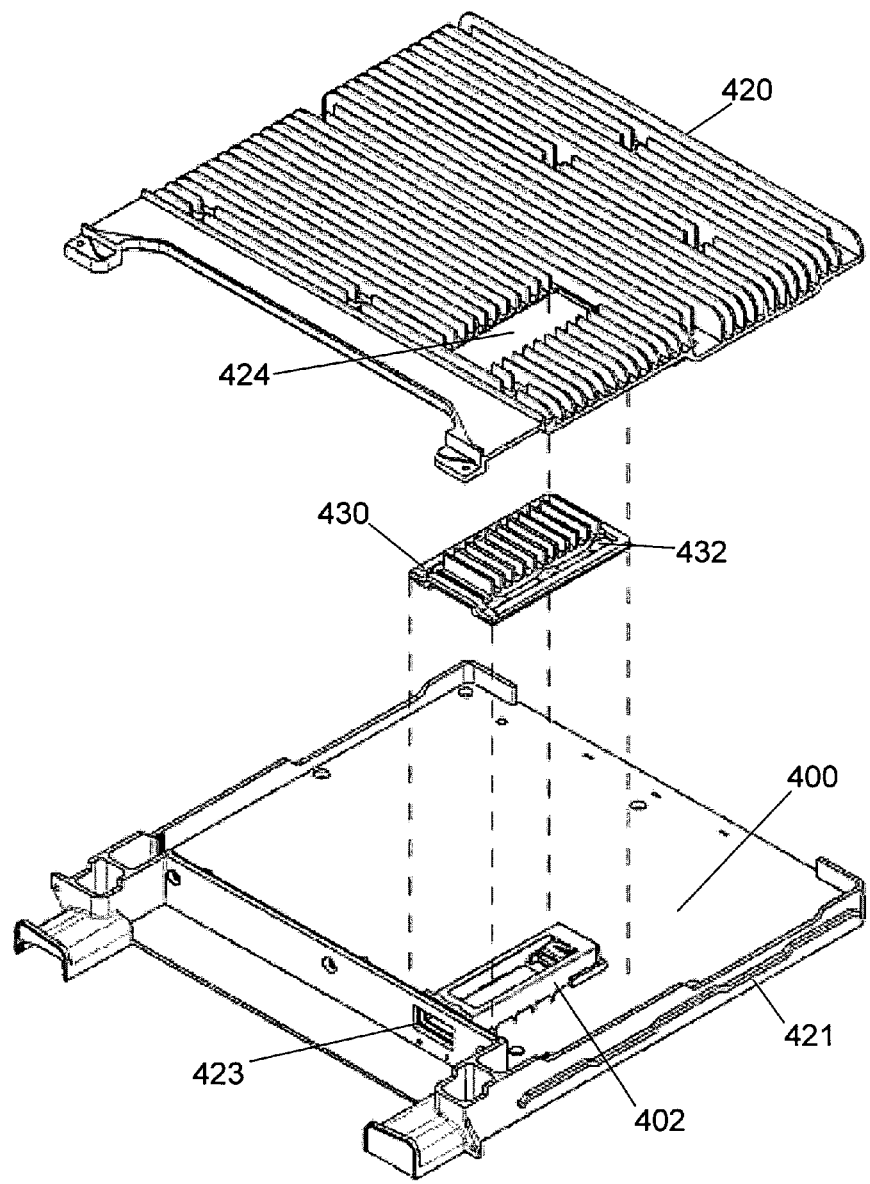
FIG. 4 is a exploded perspective view from the top of a heatsink assembly according to an embodiment of the invention.

Referring to FIG. 4, there may be seen an exploded perspective view of a clamshell enclosure using a floating heatsink according to an embodiment of the invention. A top side clamshell enclosure portion 420 is securable to bottom side clamshell enclosure portion 421. Circuit board 400, located within the clamshell enclosure when top side 420 is secured to bottom side 421, has component frame 402 mounted thereon. Component frame 402, for receiving a removable component, is mounted adjacent aperture 423 which is located on a front face of bottom side enclosure portion 421. Upon assembly of the clamshell enclosure, floating heatsink 430 mounts within aperture 424 in top side clamshell enclosure portion 420, immediately adjacent component frame 402. In operation, resilient bias member 432 urges floating heatsink 430 against a component housed within frame 402. Resilient bias member 432 also provides an electromagnetic interference gasket function within the gap between floating heatsink 430 and top side clamshell enclosure portion 420.

Figure 5:
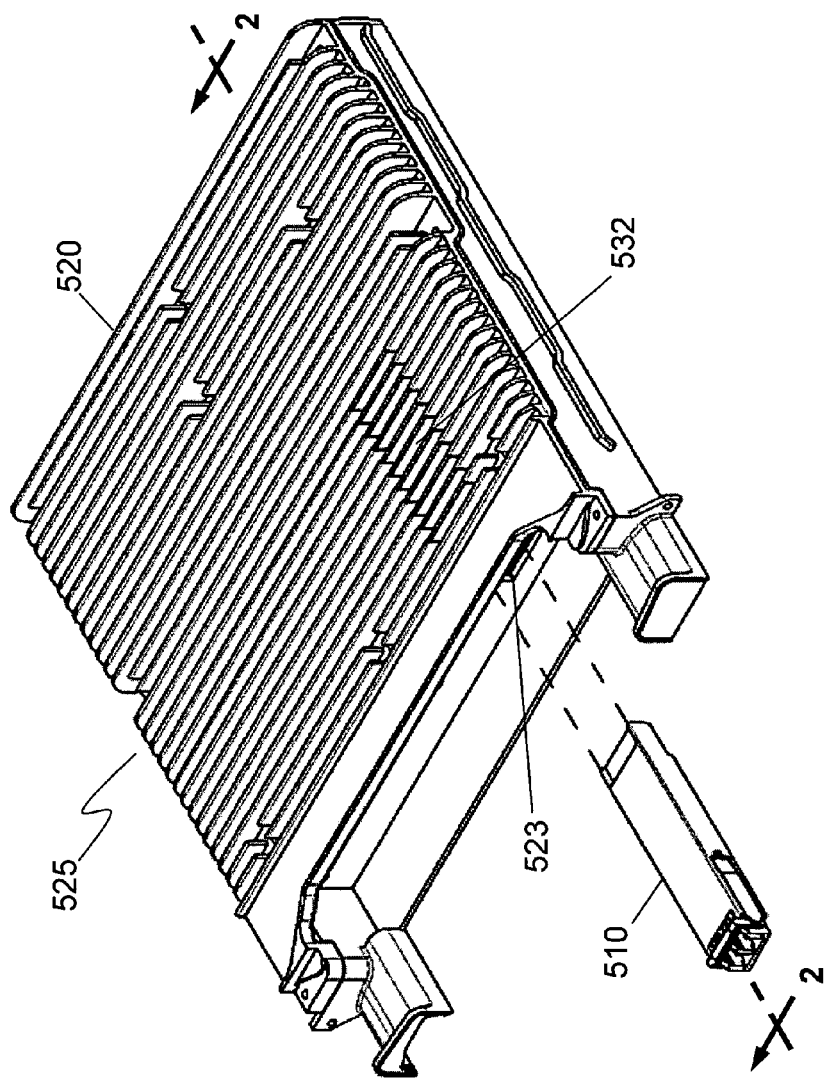
FIG. 5 is an perspective view from the top of a heatsink assembly and removable component according to an embodiment of the invention.

Referring to FIG. 5, there may be seen an assembled clamshell enclosure 525, having a removable component 510 in position for insertion into aperture 523. Upon insertion into aperture 523, removable component 510 passes into the component frame (not seen in this diagram) and bears against floating heatsink 532. The resilient bias member mounted between the top surface 520 and floating heatsink 532 urges heatsink 532 against removable component 510, providing good thermal contact. Also, as described previously, the resilient bias member also serves as a gasket, blocking or attenuating electromagnetic radiation that might enter or exit the clamshell enclosure around the periphery of floating heatsink 532.

Referring to FIG. 6A, there may be seen a cross-sectional view of FIG. 5 taken at section 2 and a corresponding cross-sectional view with the removable component 610 inserted at FIG. 6B. More specifically, clamshell enclosure 625 has top side enclosure member 620 having aperture 624 therein. Floating heatsink 630 resides within aperture 624, having resilient bias member 632 between heatsink 630 and top side enclosure member 620. Removable component 610, illustrated in the removed position in FIG. 6A, upon insertion, bears against heatsink 630. In the inserted position, illustrated in FIG. 6B, resilient bias member 632 urges the heatsink 630 against removable component 610, providing good thermal contact.

As may be seen, the assemblies described above provide one skilled in the art a method and apparatus for providing thermal contact for removable components and maintenance of the integrity of an electromagnetic screening enclosure so as to prevent either emissions or admission of electromagnetic radiations. As well, the aforedescribed assemblies provide allowance for mechanical tolerances incurred in manufacturing and over the operational life of the assembly, as well as control of contact forces via the resilient bias member for proper thermal and interconnection performance. Further, the described design provides for a reduction in size over approaches which do not integrate the bias member functionality with electromagnetic gasketing. This reduction in size allows for greater utilization of the interior space of the clamshell enclosure.

While the invention has been described in conjunction with specific embodiments thereof, it is evident that many alternatives, modifications, and variations will be apparent to those skilled in the art in light of the foregoing description.

For example, the floating heatsink assembly within a clamshell enclosure could be adapted to non-removable components fixed to the circuit board, eliminating the usual need for a compliant thermal compound to fill the space between the fixed component and the heatsink. In this type of application, the elimination of the thermal compound would both simplify initial manufacturing processes and any subsequent repair processes.

As well, the clamshell type of enclosure exemplifies but one kind of containment enclosure. It is contemplated that electronic assemblies having portions of the assembly enclosed, albeit not wholly as in the clamshell embodiment, could also make use of the floating heatsink for removable components requiring heatsinking within the enclosed portion.

Therefore, what has been described are embodiments providing means for mounting a removable component to a circuit pack where the circuit pack is enclosed in a fixed heatsink. By utilizing a floating heatsink mounted within an aperture of the fixed heatsink, in coordination with a resilient bias member that also acts as an electromagnetic containment gasket, component removability is obtained while still effecting electromagnetic shielding and thermal contact between the heatsink and component.

Numerous modifications, variations and adaptations may be made to the particular embodiments of the invention described above without departing from the scope of the invention, which is defined in the claims. Accordingly, it is intended to embrace all such alternatives, modifications, and variations as fall within the spirit and broad scope of the appended claims.

What is claimed is:

1. An apparatus for removing heat from a removable component to be inserted within an enclosure, said enclosure having a first aperture adjacent to said component when said component is in an operating position, the apparatus comprising:
   a floating heatsink disposed interior to said enclosure adjacent to said first aperture, said floating heatsink dimensioned to overlap said enclosure around the periphery of said first aperture;
   a first resilient bias member disposed between at least a portion of an overlap between said floating heatsink and said enclosure, wherein said first resilient bias member acts as an electromagnetic gasket between said floating heatsink and said enclosure; and
   whereby said first resilient bias member urges said floating heatsink against said component in the operating position.

2. An apparatus as claimed in claim 1 wherein said floating heatsink further has a channel thereinscribed on the surface adjacent to said enclosure, and said first resilient bias member is disposed in said channel.

3. An apparatus as claimed in claim 1 wherein said enclosure further has a channel thereinscribed on the surface adjacent to said floating heatsink, and said first resilient bias member is disposed in said channel.

4. An apparatus as claimed in claim 1 wherein said enclosure further comprises a second aperture, and said component may be removed from said enclosure via said second aperture.

5. An apparatus as claimed in claim 4 wherein said floating heatsink further has a channel thereinscribed on the surface adjacent to said enclosure, and said first resilient bias member is disposed in said channel.

6. An apparatus as claimed in claim 5 wherein said first resilient bias member comprises a formed metallic strip.

7. An apparatus as claimed in claim 5 wherein said first resilient bias member comprises a elastomeric compound having electrically conductive media dispersed therethrough.

8. An apparatus as claimed in claim 4 wherein said enclosure further has a channel thereinscribed on the surface adjacent to said floating heatsink, and said first resilient bias member is disposed in said channel.

9. An apparatus as claimed in claim 8 wherein said first resilient bias member comprises a formed metallic strip.

10. An apparatus as claimed in claim 8 wherein said first resilient bias member comprises a elastomeric compound having electrically conductive media dispersed therethrough.

11. A method for removing heat from a removable component to be inserted within an enclosure, said enclosure having a first aperture adjacent to said component when said component is in an operating position, the method comprising the steps of:

disposing interior to said enclosure a floating heatsink adjacent to said first aperture, said floating heatsink dimensioned to overlap said enclosure around the periphery of said first aperture;

disposing a first resilient bias member between at least a portion of an overlap between said floating heatsink and said enclosure, wherein said first resilient bias member acts as an electromagnetic gasket between said floating heatsink and said enclosure; and urging by the action of said first resilient biasing member said floating heatsink against said component, when said component is in the operating position.

12. A method as claimed in claim 11 wherein said floating heatsink further has a channel thereinscribed on the surface adjacent to said enclosure, and said first resilient bias member is disposed in said channel.

13. A method as claimed in claim 11 wherein said enclosure further has a channel thereinscribed on the surface adjacent to said floating heatsink, and said first resilient bias member is disposed in said channel.

14. A method as claimed in claim 11 wherein said enclosure further comprises a second aperture, and said component may be removed from said enclosure via said second aperture.

15. A method as claimed in claim 14 wherein said floating heatsink further has a channel thereinscribed on the surface adjacent to said enclosure, and said first resilient bias member is disposed in said channel.

16. A method as claimed in claim 15 wherein said first resilient bias member comprises a formed metallic strip.

17. A method as claimed in claim 15 wherein said first resilient bias member comprises a elastomeric compound having electrically conductive media dispersed therethrough.

* * * * *